(12) United States Patent
Assaderaghi et al.

(10) Patent No.: US 7,075,153 B2
(45) Date of Patent: Jul. 11, 2006

(54) GROUNDED BODY SOI SRAM CELL

(75) Inventors: Fariborz Assaderaghi, San Diego, CA (US); Andres Bryant, Essex Junction, VT (US); Peter E. Cottrell, Essex Junction, VT (US); Robert J. Gauthier, Jr., Hinesburg, VT (US); Randy W. Mann, Jericho, VT (US); Edward J. Nowak, Essex Junction, VT (US); Jed H. Rankin, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 47 days.

(21) Appl. No.: 10/640,807

(22) Filed: Aug. 14, 2003

(65) Prior Publication Data

US 2004/0048425 A1    Mar. 11, 2004

Related U.S. Application Data

(62) Division of application No. 09/915,061, filed on Jul. 25, 2001, now Pat. No. 6,646,305.

(51) Int. Cl.
*H01L 27/01*    (2006.01)
*H01L 27/12*    (2006.01)
*H01L 31/0392*  (2006.01)

(52) U.S. Cl. .............. 257/351; 257/347; 257/350; 257/E27.112; 257/E21.32; 257/E21.561; 257/E21.564

(58) Field of Classification Search ........ 257/347–354, 257/903, E27.112, E21.32, E21.561, E21.564
See application file for complete search history.

(56) References Cited

U.S. PATENT DOCUMENTS

| | | | |
|---|---|---|---|
| 5,072,286 A * | 12/1991 | Minami et al. ............. 257/208 |
| 5,145,802 A | 9/1992 | Tyson et al. | |
| 5,162,889 A * | 11/1992 | Itomi ........................ 257/69 |
| 5,452,247 A * | 9/1995 | Takao ....................... 365/182 |
| 5,670,388 A | 9/1997 | Machesney et al. | |
| 5,909,618 A | 6/1999 | Forbes et al. | |
| 6,018,172 A | 1/2000 | Hidaka et al. | |
| 6,177,300 B1 * | 1/2001 | Houston et al. ............. 438/149 |
| 6,646,305 B1 * | 11/2003 | Assaderaghi et al. ....... 257/347 |

* cited by examiner

*Primary Examiner*—Kenneth Parker
*Assistant Examiner*—Jesse A. Fenty
(74) *Attorney, Agent, or Firm*—Schmeiser, Olsen & Watts; Anthony Canale

(57) ABSTRACT

A semiconductor memory device comprising: an SOI substrate having a thin silicon layer on top of a buried insulator; and an SRAM comprising four NFETs and two PFETs located in the thin silicon layer, each the NFET and PFET having a body region between a source region and a drain region, wherein the bodies of two of the NFETs are electrically connected to ground. Additionally, the bodies of the two PFETs are electrically connected to $V_{DD}$.

1 Claim, 10 Drawing Sheets

GROUNDED BODY SOI SRAM CELL

This application is a divisional of Ser. No. 09/915,061; filed on Jul. 25, 2001 now U.S. Pat. No. 6,646,305.

FIELD OF THE INVENTION

The present invention relates to the field of semiconductor memory devices; more specifically, it relates to a static random access memory (SRAM) formed on a silicon-on-insulator (SOI) substrate and the method of fabricating the SRAM.

BACKGROUND OF THE INVENTION

NFET and PFET devices fabricated in SOI technology offer advantages over bulk devices. The advantages include reduced junction capacitance, reduced junction leakage current, and for fully depleted devices, reduced short channel effect, increased transconductance and reduced threshold voltage ($V_T$) sensitivity. However, SOI FETs have a "floating body." The body or channel region of the FET is formed in an insulated pocket of silicon and is therefore not electrically connected to a fixed potential. One effect of the "floating body" is to lower the $V_T$ of the device when the body "floats up". This is a particular problem in a SRAM cell as lowering the $V_T$ of the devices can cause the relative strengths of devices to change such that the cell flips when the state of the latch is read.

FIG. 1 is a schematic circuit diagram of a CMOS SOI SRAM cell. In FIG. 1, an SRAM cell 100 comprises a first input/output (I/O) NFET 105 and a second I/O NFET 110. SRAM cell 100 further comprises a first latch NFET 115, a second latch NFET 120, a first latch PFET 125 and a second latch PFET 130. The gate of first I/O NFET 105 is coupled to a wordline 135, the source of the first I/O NFET to a bitline 140 and the drain of the first I/O NFET to a first common node 145. The gate of second I/O NFET 110 is coupled to a wordline 135, the source of the second I/O NFET to a bitline-not 155 and the drain of the second I/O NFET to a second common node 160. The gates of first latch NFET 115 and first latch PFET 125 are coupled to second node 160. The gates of second latch NFET 120 and latch PFET 130 are coupled to first node 145. The source of first latch NFET 115 is coupled to ground (GND) and the drain of the first latch NFET is coupled to first node 145. The source of second latch NFET 120 is coupled to GND and the drain of the first latch NFET is coupled to second node 160. Similarly, the source of first latch PFET 125 is coupled to $V_{DD}$ and the drain of the first latch PFET is coupled to first node 145. The source of second latch PFET 130 is coupled to $V_{DD}$ and the drain of the first latch PFET is coupled to second node 160. The bodies of all four NFETs 105, 110, 115, and 120 and both PFETs 125 and 130 are floating.

SRAM cell 100 is written to by writing bitline 140 high and bitline-not 155 low (or vice versa). SRAM cell 100 is read by activating either first I/O NFET 105 (or second I/O NFET 110) and sensing the current flow from bitline 140 (or bitline-not 155) to GND. If first I/O NFET 105 "floats up" such that the $V_T$ of the first I/O NFET becomes lower than the $V_T$ of first latch NFET 115 (or second I/O NFET 110 "floats up" such that the $V_T$ of the second I/O NFET becomes lower than the $V_T$ of second latch NFET 120) SRAM cell 100 will become unstable and liable to flip states when read. A device with a low $V_T$ is a strong device.

In FIG. 1, first NFET 105 is designated as T1, second I/O NFET 110 as T2, first latch NFET 115 as T3, second latch NFET 120 as T4, first latch PFET 125 as T5 and second latch PFET 130 as T6. This convention is used in all subsequent figures as an aid to reading and comparing the drawings.

FIG. 2 is a partial cross sectional view of a portion of the SRAM cell of FIG. 1. FIG. 2 specifically shows the structure and wiring of second I/O NFET 110 and second latch NFET 120. Formed in a substrate 165 is a buried oxide layer 170 Formed on top of buried oxide layer 170 is a thin silicon layer 175. Formed in thin silicon layer 175 is an STI 180. STI 180 extends from a top surface 185 of thin silicon layer 175, through the thin silicon layer, to buried oxide layer 170. Formed in thin silicon layer is a source 190 of second latch NFET 120, a source 195 of second I/O NFET 110 and a common drain 200. Both second latch NFET 120 and second I/O NFET 110 share common drain 200. In silicon layer 175 and under a gate 205 of second latch NFET 120 is a second latch NFET body 210. In silicon layer 175 and under a gate 215 of second I/O NFET 110 is a second I/O NFET body 220. Source 190 of second latch NFET 120 is coupled to GND and gate 205 is coupled to first node 145. Source 195 of second I/O NFET 110 is coupled to bitline-not 155 and gate 215 is coupled to wordline 135. Common drain 200 is coupled to second node 160.

In FIG. 2, second I/O NFET 110 and second latch NFET 120 are illustrated as fully depleted devices. Thus, second latch NFET body 210 and second I/O NFET body 220 are co-extensive with what might otherwise be termed the channel regions of the respective devices. The actual channels themselves are formed in the respective bodies under their respective gates near top surface 185 of thin silicon layer 175.

FIG. 3 is a plan view of STI, gate, source/drain, contact and first wiring levels of a unit cell of the SRAM cell of FIG. 1. In FIG. 3, the shallow trench isolation (STI) level of SRAM cell 100 is defined by a first thin silicon region 225A and a second thin silicon region 225B. The extents of the silicon portions and the STI portions of SRAM cell 100 are set by first and second silicon regions 225A and 225B. The gate level is defined by a first gate conductor 240A, a second gate conductor 240B, a third gate conductor 240C and a fourth gate conductor 240D. First silicon region 225A is doped N+ where overlapped by an N+ region 250 except where first, second, third and fourth gate conductors 240A, 240B, 240C and 240D also overlap the first silicon region. The overlap of first silicon region 225A by first, second, third and fourth gate conductors 240A, 240B, 240C and 240D defines a first body region 250A, a second body region 250B, a third body region 250C and a fourth body region 250D respectively. Body regions 250A, 250B, 250C and 250D are doped P. First body region 250A divides first silicon region 225A into a first source region 255A and a first drain region 255B. Second body region 250B divides first silicon region 225A into a second source region 255C and a second drain region 255D. Third and fourth body region 250C and 250D further divide first silicon region 225A into a third source region 255E.

Second silicon region 225B is doped P+ where overlapped by a P+ region 260 except where third and fourth gate conductors 240C and 240D overlap the second silicon region. The overlap of second silicon region 225B by third and fourth gate conductors 240C and 240D defines a fifth body region 250E and a sixth body region 250F respectively. Body regions 250E and 250F are doped N. Fifth body region 250E divides second silicon region 225B into a third drain region 255F and a fourth source region 255G. Sixth body region 250F further divides second silicon region 225B into an fourth drain region 255H.

With reference to FIG. 1, first I/O NFET 105 comprises first source region 255A, first body region 250A, and first drain region 255B. Second I/O NFET 110 comprises second source region 255C, second body region 250B, and second drain region 255D. First latch NFET 115 comprises second source region 255C, third body region 250C, and third source region 255E. Second latch NFET 120 comprises third source region 255E, fourth body region 250D, and second drain region 255D. First latch PFET 125 comprises third drain region 255F, fifth body region 250E, and fourth source region 255G. Second latch PFET 130 comprises fourth source region 255G, sixth body region 250F, and fourth drain region 255H.

Also illustrated in FIG. 3 are a bitline contact 265 contacting first source region 255A, a ground contact 270 contacting third source region 255E, a bitline-not contact 275 contacting second source region 255C, a $V_{DD}$ contact 280, a first wordline contact 285A and a second wordline contact 285B. Wordline contacts 285A and 285B connect first gate conductor 240A and second gate conductor 240B, respectively, to a wordline 290. $V_{DD}$ contact 280 connects fourth source region 255G to a $V_{DD}$ power rail 295. A first node contact 300A connects first drain region 255B to first node conductor 305A. A second node contact 300B connects third drain region 255F to first node conductor 305A. A third node contact 300C connects gate conductor 240C to first node conductor 305A. A fourth node contact 300D connects second drain region 255D to second node conductor 305B. A fifth node contact 300E connects fourth drain region 255H to second node conductor 305B. A sixth node contact 300F connects gate conductor 240D to second node conductor 305B.

Because first body region 250A, second body region 250B, third body region 250C and fourth body region 250D, fifth body region 250E and sixth body region 250F are floating in FIG. 3, SRAM cell 100 is subject to random flips of state. Therefore, a technique of electrically connecting the bodies of SRAM FETs to a fixed potential, especially connecting all the NFETs to one fixed potential and all the PFETs to another, different potential, is needed to retain the advantages of SRAMs fabricated in SOI technology.

SUMMARY OF THE INVENTION

A first aspect of the present invention is a semiconductor memory device comprising: an SOI substrate having a thin silicon layer on top of a buried insulator; and an SRAM comprising four NFETs and two PFETs located in the thin silicon layer, each the NFET and PFET having a body region between a source region and a drain region, wherein the bodies of two of the NFETs are electrically connected to ground.

A second aspect of the present invention is a semiconductor memory device comprising: an SOI substrate having a thin silicon layer on top of a buried insulator; an SRAM comprising two I/O NFETs, two latch NFETs and two latch PFETs located in the thin silicon layer, each the I/O NFET, latch NFET and latch PFET having a body region between a source region and a drain region; and a first connecting region in the thin silicon layer abutting the body regions of the I/O NFETS, the first connecting region electrically connected to ground.

A third aspect of the present invention is a semiconductor memory device comprising: an SOI substrate having a thin silicon layer on top of a buried insulator; an SRAM comprising two I/O NFETs, two latch NFETs and two latch PFETs located in the thin silicon layer, each the I/O NFET, latch NFET and latch PFET having a body region between a source region and a drain region; a first connecting region in the thin silicon layer, the first connecting region electrically connected to ground; and a pair of second connecting regions in the thin silicon layer, each second connecting region co-extensive with one of the body regions of the I/O NFETs and between the body regions and the first connecting region.

A fourth aspect of the present invention is a method of fabricating a semiconductor memory device comprising: providing an SOI substrate having a thin silicon layer on top of a buried insulator; forming an SRAM comprising two I/O NFETs, two latch NFETs and two latch PFETs in the thin silicon layer, each the I/O NFET, latch NFET and latch PFET having a body region between source region and a drain region; forming a P+ doped first connecting region in the thin silicon layer abutting the body regions of the I/O NFETS; and forming a ground contact to the first connecting region.

A fifth aspect of the present invention is a method of fabricating a semiconductor memory device comprising: providing an SOI substrate having a thin silicon layer on top of a buried insulator; forming an SRAM comprising two I/O NFETs, two latch NFETs and two latch PFETs located in the thin silicon layer, each the I/O NFET, latch NFET and latch PFET having a body region between a source region and a drain region; forming a P+ doped first connecting region in the thin silicon layer; forming a pair of second connecting regions in the thin silicon layer, each second connecting region co-extensive with one of the body regions of the I/O NFETs and between the body regions and the first connecting region; and forming a ground contact to the first connecting region.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 1:
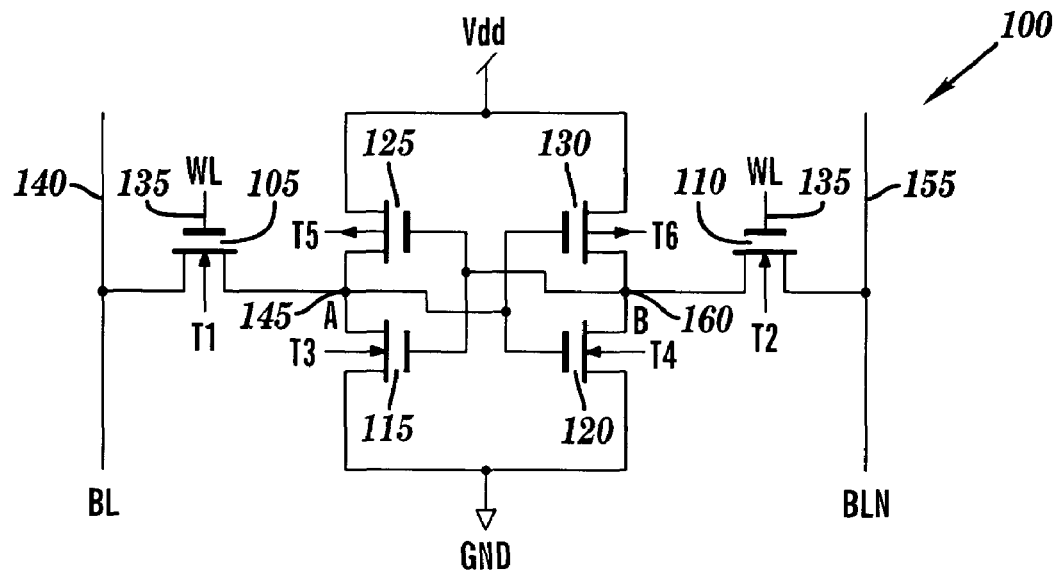
FIG. 1 is a schematic circuit diagram of a CMOS SOI SRAM cell.
Figure 2:
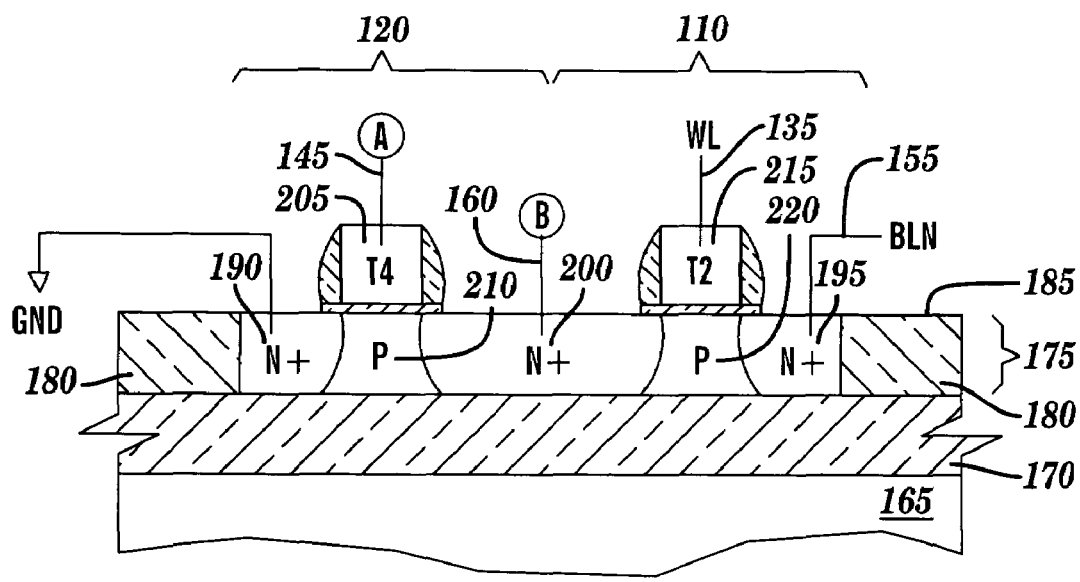
FIG. 2 is a partial cross sectional view of a portion of the SRAM cell of FIG. 1.

The invention will be described below, with reference to the drawings, as a series of modifications to SRAM cell 100 illustrated in FIGS. 1 and 3 and described above. In the drawings the same reference numbers indicate the same or corresponding regions.

Figure 4:
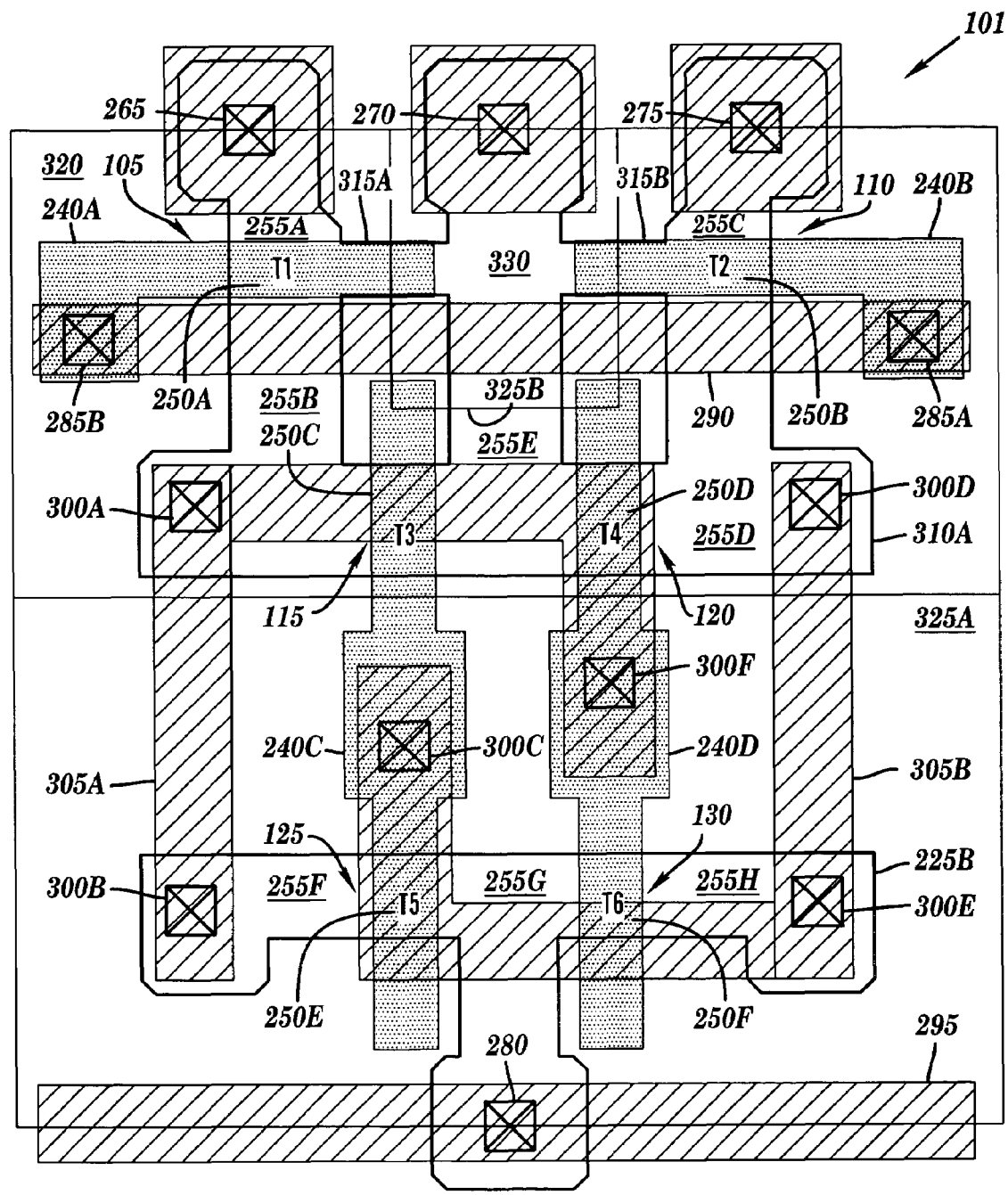
FIG. 4 is a plan view of STI, gate, source/drain, contact and first metal levels of a unit cell of the SRAM cell according to a first embodiment of the present invention.

FIG. 4 is a plan view of STI, gate, source/drain, contact and first metal levels of a unit cell of the SRAM cell according to a first embodiment of the present invention. In the first embodiment of the invention, the bodies of the I/O NFETs are tied to ground.

In FIG. 4, the STI level of an SRAM cell 101 is defined by a first thin silicon region 310A and second thin silicon region 225B. The extents of the silicon portions and the STI portions of SRAM cell 101 are set by first and second silicon regions 310A and 225B. First silicon region 310A differs from first silicon region 225A of FIG. 3. First silicon region 310A includes a first connecting region 315A and a second connecting region 315B. First connecting region 315A is co-extensive with said first body region 250A and said second connecting region is co-extensive with said second body region 250B. First silicon region 310A is doped N+ where overlapped by an N+ region 320 except (1) where first, second, third and fourth gate conductors 240A, 240B, 240C and 240D overlap the first silicon region and (2) where a second P+ region 325B overlaps the first silicon region, which overlap defines a third (P+ doped) connecting region 330. Third connecting region 330 abuts first connecting region 315A, second connecting region 315B and third source region 255E. Ground contact 270 contacts third connecting region 330. The overlap of first silicon region 310A by first, second, third and fourth gate conductors 240A, 240B, 240C and 240D defines first body region 250A, second body region 250B, third body region 250C and fourth body region 250D respectively.

Second silicon region 225B is doped P+ where overlapped by a P+ region 325A except where third and fourth gate conductors 240C and 240D also overlap the second silicon region. The overlap of second silicon region 225B by third and fourth gate conductors 240C and 240D defines a fifth body region 250E and a sixth body region 250F.

First connecting region 315A connects first body region 250A to third connecting region 330 thereby providing a path to ground for the body of first I/O NFET 105. Second connecting region 315B connects second body region 250B to third connecting region 330 thereby providing a path to ground for the body of second I/O NFET 110.

Figure 7:
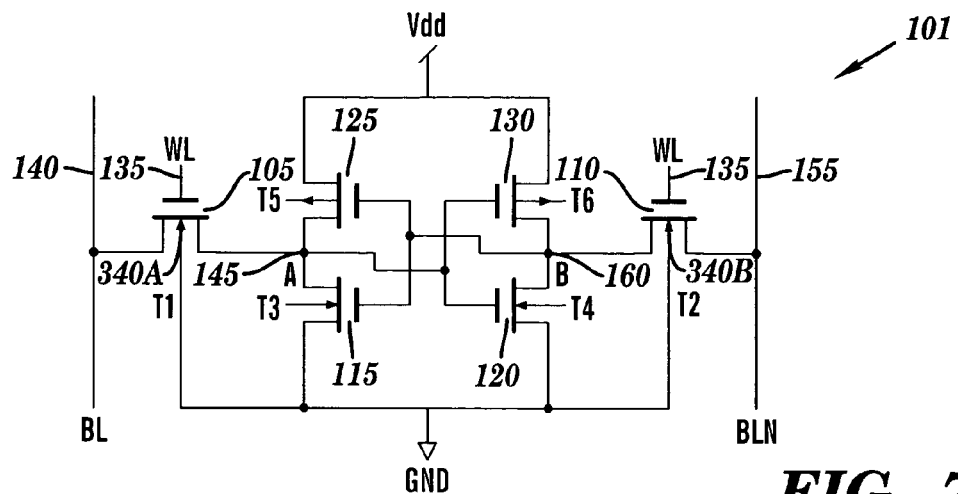
FIG. 7 is a schematic circuit diagram of the SRAM cell of FIG. 4 according to the present invention.

Turning to FIG. 7, FIG. 7 is a schematic circuit diagram of the SRAM cell of FIG. 4 according to the present invention. SRAM cell 101 of FIG. 7 differs from SRAM cell 100 of FIG. 1 in that a body 340A of first I/O NFET 105 and a body 340B of second I/O NFET 110 are coupled to GND.

Figure 5:
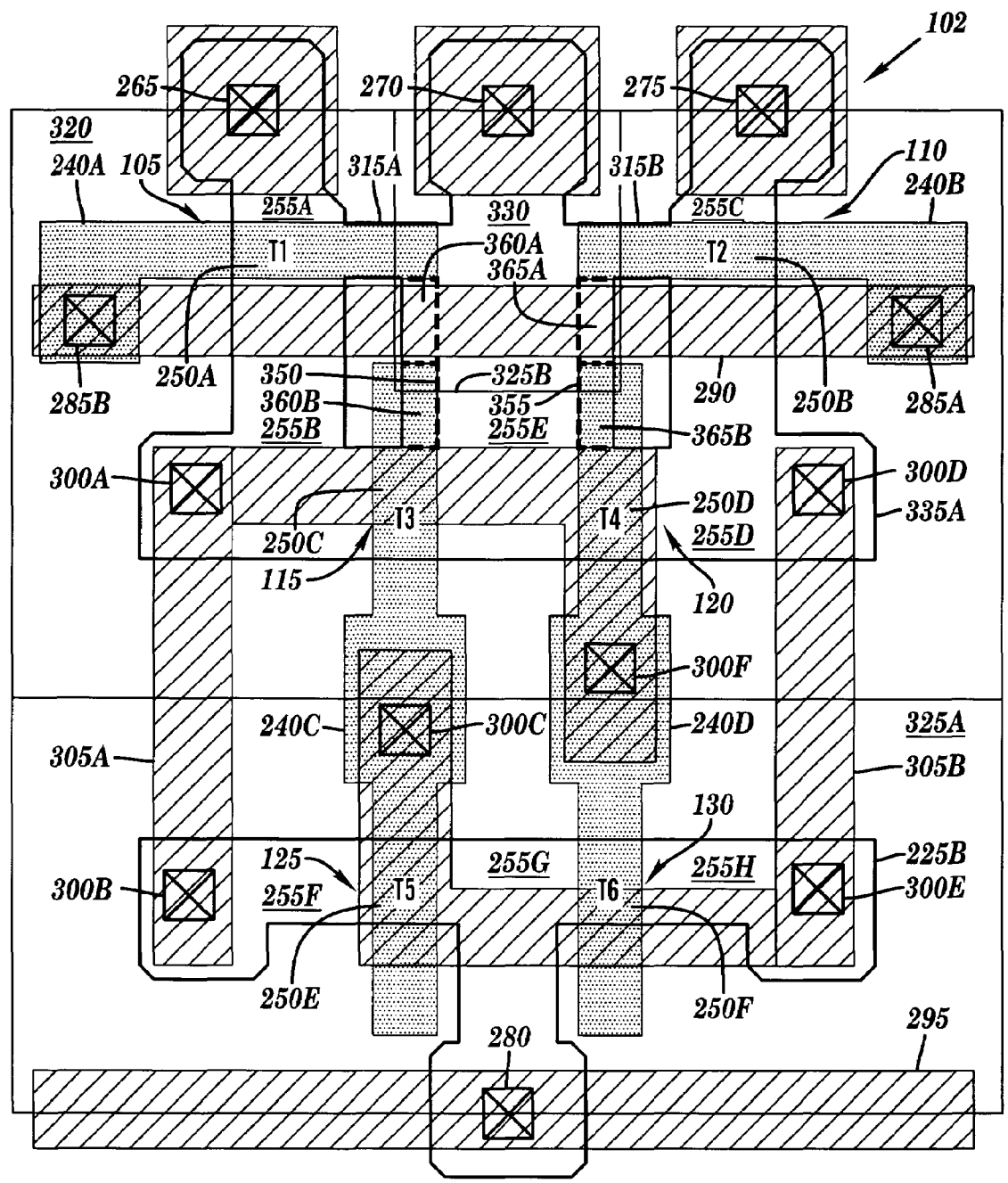
FIG. 5 is a plan view of STI, gate, source/drain, contact and first metal levels of a unit cell of the SRAM cell according to a second embodiment of the present invention.

FIG. 5 is a plan view of STI, gate, source/drain, contact and first metal levels of a unit cell of the SRAM cell according to a second embodiment of the present invention. In the second embodiment of the invention, the bodies of the I/O NFETs and the latch NFETS are tied to ground.

In FIG. 5, the STI level of an SRAM cell 102 is defined by a first thin silicon region 335A and second thin silicon region 225B. The extents of the silicon portions and the STI portions of SRAM cell 102 are set by a first silicon region 335A and second silicon region 225B. First silicon region 335A differs from first silicon region 225A of FIG. 3. First silicon region 335A includes first connecting region 315A and second connecting region 315B. First silicon region 335A is doped N+ where overlapped by N+ region 320 except (1) where first, second, third and fourth gate conductors 240A, 240B, 240C and 240D overlap the first silicon region and (2) where second P+ region 325B overlaps the first silicon region, which overlap defines a third (P+ doped) connecting region 330. The overlap of first silicon region 335A by first, second, third and fourth gate conductors 240A, 240B, 240C and 240D defines first body region 250A, second body region 250B, third body region 250C and fourth body region 250D respectively.

Figure 3:
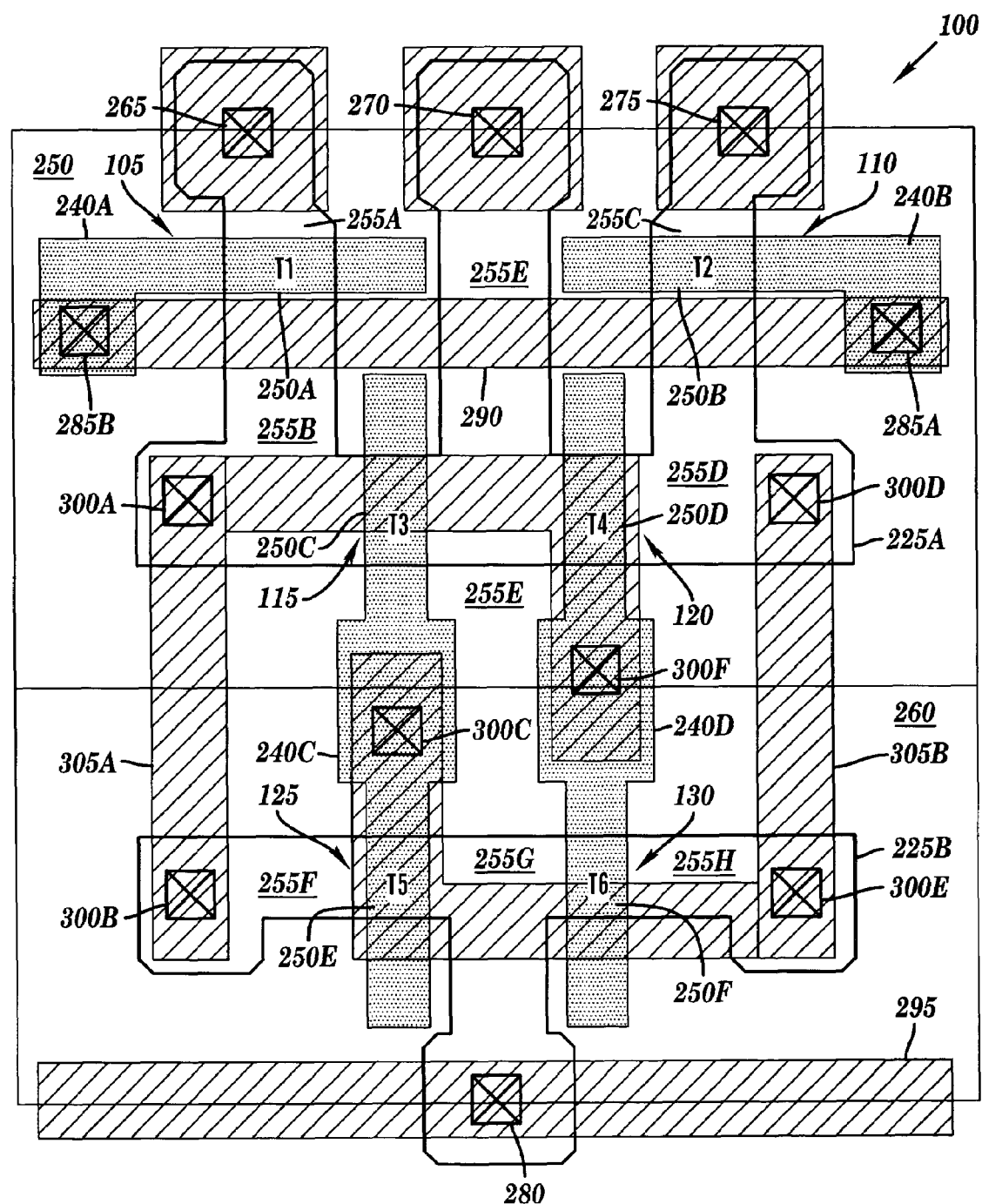
FIG. 3 is a plan view of STI, gate, source/drain, contact and first metal levels of a unit cell of the SRAM cell of FIG. 1.

First silicon region 335A further differs from first silicon region 225A of FIG. 3 in that the first silicon region boundary is adjusted to provide for a fourth connecting region 350 and a fifth connecting region 355 as indicated by the heavy dashed lines adjacent to the first silicon region. A first portion 360A of fourth connecting region 350 is co-extensive with third connecting region 330 and a second portion 360B of the fourth connecting region is co-extensive with third body region 250C. First portion 360A is doped P+. A first portion 365A of fifth connecting region 355 is co-extensive with third connecting region 330 and a second portion 365B of the fifth connecting region is co-extensive with fourth body region 250D. First portion 365A is doped P+. Third connecting region 330 abuts first connecting region 315A, second connecting region 315B and third source region 255E, second portion 360B of fourth connecting region. 350 and second portion 365B of fifth connecting region 355. Ground contact 270 contacts third connecting region 330.

Second silicon region 225B is doped P+ where overlapped by P+ region 325A except where third and fourth gate conductors 240C and 240D overlap the second silicon region. The overlap of second silicon region 225B by third and fourth gate conductors 240C and 240D defines fifth body region 250E and sixth body region 250F.

First connecting region 315A connects first body region 250A to third connecting region 330 thereby providing a path to ground for the body of first I/O NFET 105. Second connecting region 315B connects second body region 250B to third connecting region 330 thereby providing a path to ground for the body of second I/O NFET 110. Fourth connecting region 350 connects third body region 250C to third connecting region 330 thereby providing a path to ground for the body of first latch NFET 115. Fifth connecting region 355 connects fourth body region 250D to third connecting region 330 thereby providing a path to ground for the body of second latch NFET 120.

Figure 8:
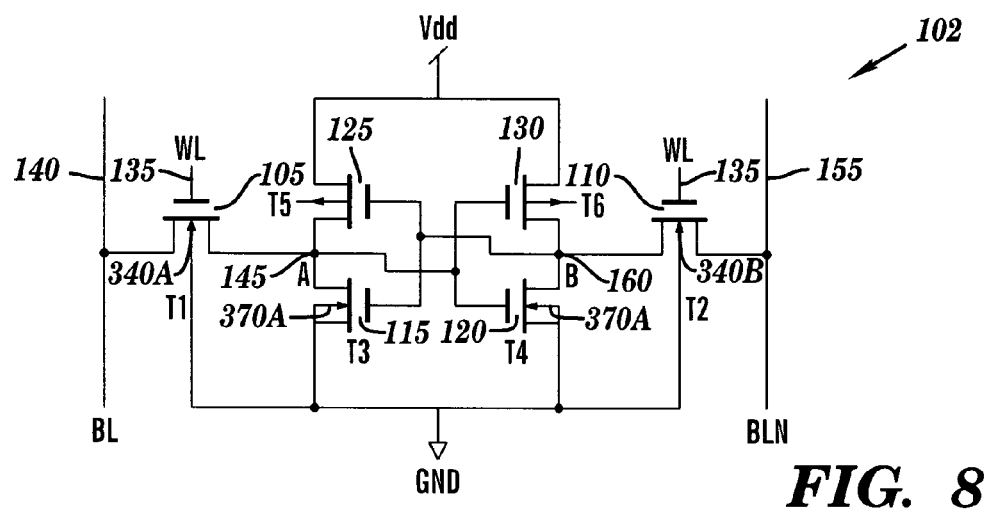
FIG. 8 is a schematic circuit diagram of the SRAM cell of FIG. 5 according to the present invention.

Turning to FIG. 8, FIG. 8 is a schematic circuit diagram of the SRAM cell of FIG. 5 according to the present invention. SRAM cell 102 of FIG. 8 differs from SRAM cell 100 of FIG. 1 in that body 340A of first I/O NFET 105, body 340B of second I/O NFET 110, a body 370A of first latch NFET 115 and a body 370A of second latch NFET 120 are coupled to GND.

Figure 6:
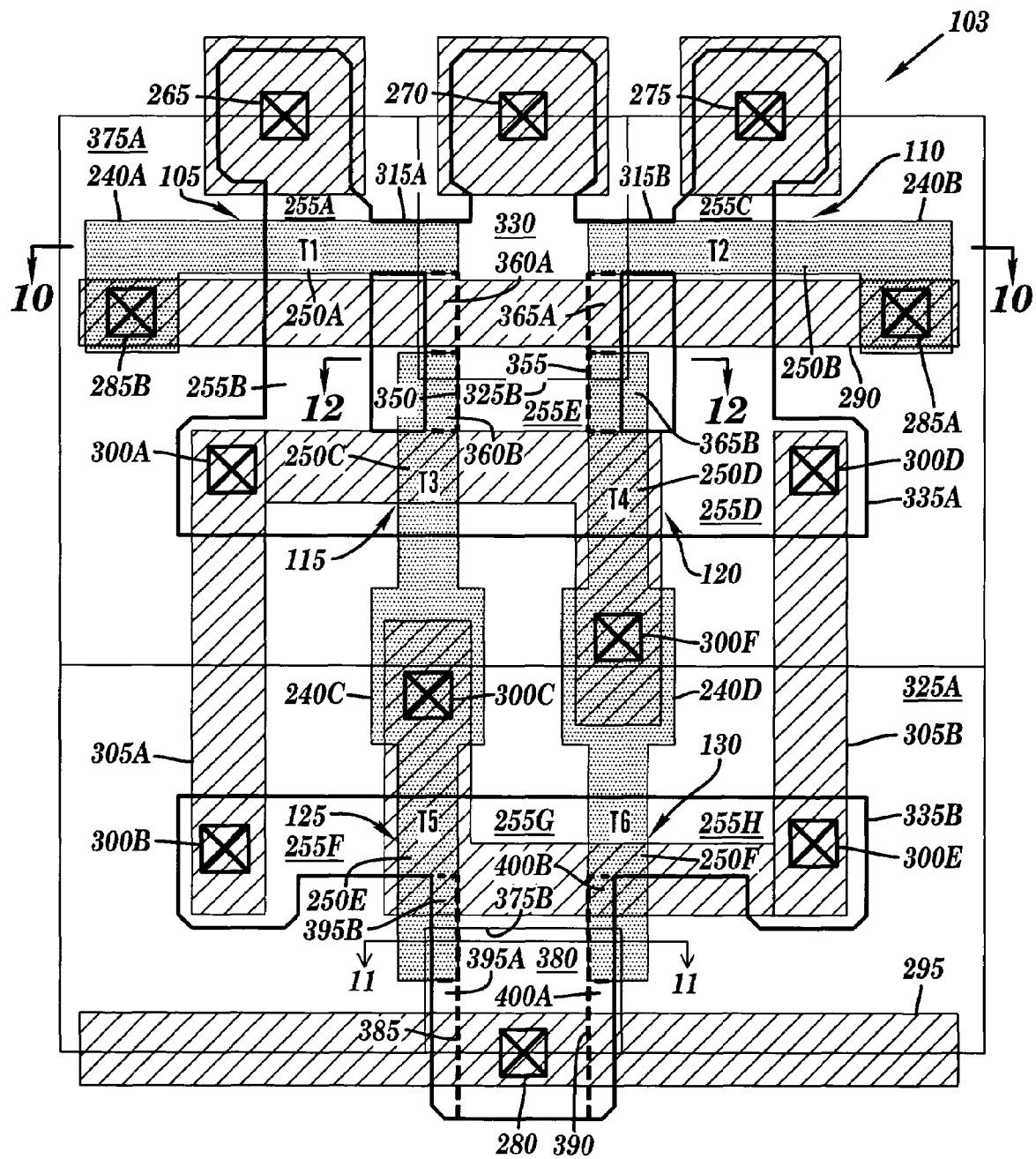
FIG. 6 is a plan view of STI, gate, source/drain, contact and first metal levels of a unit cell of the SRAM cell according to a third embodiment of the present invention.

FIG. 6 is a plan view of STI, gate, source/drain, contact and first metal levels of a unit cell of the SRAM cell according to a third embodiment of the present invention. In the third embodiment of the invention, the bodies of the I/O NFETs and the latch NFETs are tied to ground and the bodies of the latch PFETS are tied to $V_{DD}$.

In FIG. 6, the STI level of an SRAM cell 103 is defined by first thin silicon region 335A and a second thin silicon region 335B. The extents of the silicon portions and the STI portions of SRAM cell 103 are set by first silicon region 335A and second silicon region 335B. First silicon region 335A differs from first silicon region 225A of FIG. 3. First silicon region 335A includes first connecting region 315A and second connecting region 315B. First silicon region 335A is doped N+ where overlapped by an N+ region 375A except (1) where first, second, third and fourth gate conductors 240A, 240B, 240C and 240D also overlap the first silicon region and (2) where second P+ region 325B overlaps the first silicon region, which overlap defines third (P+ doped) connecting region 330. The overlap of first silicon region 335A by first, second, third and fourth gate conductors 240A, 240B, 240C and 240D defines first body region 250A, second body region 250B, third body region 250C and fourth body region 250D respectively.

First silicon region 335A further differs from first silicon region 225A of FIG. 3 in that the first silicon region boundary is adjusted to provide for fourth connecting region 350 and fifth connecting region 355 as indicated by the heavy dashed lines adjacent to the first silicon region. First portion 360A of fourth connecting region 350 is co-extensive with third connecting region 330 and second portion 360B of the fourth connecting region abuts third body region 250C. First portion 360A is doped P+. First portion 365A of fifth connecting region 355 is co-extensive with third connecting region 330 and second portion 365B of the fifth connecting region abuts fourth body region 250D. First portion 365A is doped P+. Third connecting region 330 abuts first connecting region 315A, second connecting region 315B and third source region 255E, second portion 360B of fourth connecting region 350 and second portion 365B of fifth connecting region 355. Ground contact 270 contacts third connecting region 330.

Second silicon region 335B is doped P+ where overlapped by P+ region 325A except where (1) third and fourth gate conductors 240C and 240D also overlap the first silicon region and (2) where a second N+ region 375B overlaps the first silicon region, which overlap defines sixth (P+ doped) connecting region 380. The overlap of second silicon region 375B by third and fourth gate conductors 240C and 240D defines first body region 250A, second body region 250B, third body region 250C and fourth body region 250D respectively Second silicon region 335B differs from second silicon region 225B of FIG. 3 in that the first silicon region boundary is adjusted to provide for a seventh connecting region 385 and an eighth connecting region 390 as indicated by the heavy dashed lines adjacent to the second silicon region. A first portion 395A of seventh connecting region 385 is co-extensive with sixth connecting region 380 and a second portion 395B of the seventh connecting region is co-extensive with fifth body region 250E. First portion 395A is doped N+. A first portion 400A of eighth connecting region 390 is co-extensive with sixth connecting region 380 and a second portion 400B of the eighth connecting region is co-extensive with sixth body region 250F. Sixth connecting region 380 abuts second portion 395B of seventh connecting region 385, second portion 400B of eighth connecting region 390 and fourth source region 255G. As drawn in FIG. 6, first portion 395A of seventh connecting region 385 is not required for the invention to function as second portion 395B of the seventh connecting region abuts sixth connecting region 380. Similarly, first portion 400A of eight connecting region 390 is not required for the invention to function as second portion 400B of the seventh connecting region abuts sixth connecting region 380. $V_{DD}$ contact 280 contacts sixth connecting region 380.

First connecting region 315A connects first body region 250A to third connecting region 330 thereby providing a path to ground for the body of first I/O NFET 105. Second connecting region 315B connects second body region 250B to third connecting region 330 thereby providing a path to ground for the body of second I/O NFET 110. Fourth connecting region 350 connects third body region 250C to third conducting channel 330 thereby providing a path to ground for the body of first latch NFET 115. Fifth connecting region 355 connects fourth body region 250D to third conducting channel 330 thereby providing a path to ground for the body of second latch NFET 120. Seventh conducting channel 385 connects fifth body region 250E to sixth connecting region 380 thereby providing a path to $V_{DD}$ for the body of first latch PFET 125. Eighth conducting channel 390 connects sixth body region 250F to sixth connecting region 380 thereby providing a path to $V_{DD}$ for the body of second latch PFET 130.

Figure 9:
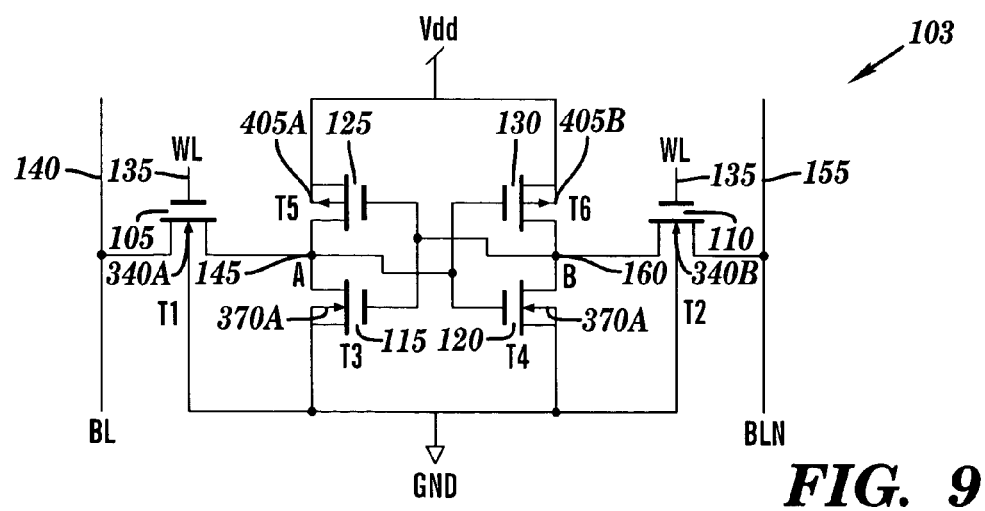
FIG. 9 is a schematic circuit diagram of the SRAM cell of FIG. 6 according to the present invention.

Turning to FIG. 9, FIG. 9 is a schematic circuit diagram of the SRAM cell of FIG. 6 according to the present invention. SRAM cell 103 of FIG. 9 differs from SRAM cell 100 of FIG. 1 in that body 340A of first I/O NFET 105, body 340B of second I/O NFET 110, a body 370A of first latch NFET 115 and a body 370A of second latch NFET 120 are coupled to GND and in that body 405A of first latch PFET 125 and body 405B of second latch PFET 130 are tied to $V_{DD}$.

Other combinations of grounded body NFETs and $V_{DD}$ tied body PFETs are possible using the method described above. In a first example, bodies of the I/O NFETs 105 and 110 are tied to ground while the bodies of latch PFETs 125 and 130 are tied to $V_{DD}$ by replacing second silicon region 225B in FIG. 4 with second silicon region 335B from FIG. 6 and also adding second N+ region 375B to FIG. 4. In a second example, the bodies of latch NFETs 115 and 120 are tied to ground while the bodies of latch PFETs 125 and 130 are tied to $V_{DD}$ by eliminating the portions first and second connecting region that abut first source region 255A and first drain region 255B in FIG. 6. In a third example, only the bodies of latch PFETs 125 and 130 are tied to $V_{DD}$ by eliminating first and second channels 315A and 315B, second P+ implant region 325B and third connecting region 330 from FIG. 6. In a fourth example, only the bodies of latch NFETs 115 and 120 are tied to $V_{DD}$ by eliminating the portions first and second connecting region that abut first source region 255A and first drain region 255B in FIG. 4. Non-symmetrical combinations are also possible. In a fifth example, the bodies of I/O NFET 105 and latch NFET 115 are tied to ground while the body of latch PFET 125 is tied to $V_{DD}$. In a sixth example, the bodies of I/O NFET 110 and latch NFET 120 are tied to ground while the body of latch PFET 130 is tied to $V_{DD}$.

Turning to the fabrication of the present invention, FIGS. 10A through 10E are partial cross sectional views illustrating fabrication of I/O NFETs taken along line 10—10 of FIG. 6 in SOI technology and FIGS. 11A through 11E are partial cross sectional views illustrating fabrication of latch PFETs taken along line 11—11 of FIG. 6 in SOI technology. The operations illustrated in FIGS. 10A through 10E may be performed simultaneously with the operations illustrated in FIGS. 11A through 11E and will so be described.

Figure 10A:
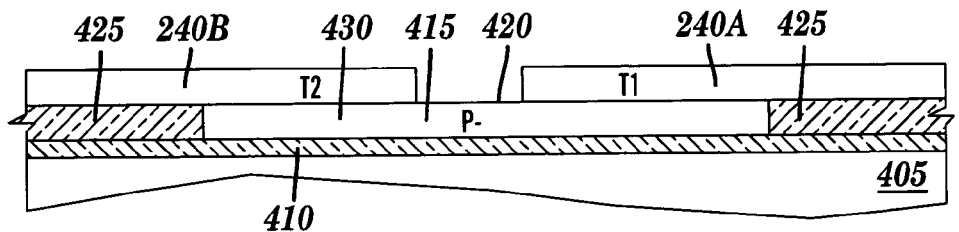
FIGS. 10A through 10E are partial cross sectional views illustrating fabrication of I/O NFETs taken along line 10—10 of FIG. 6 in SOI technology.
Figure 11A:
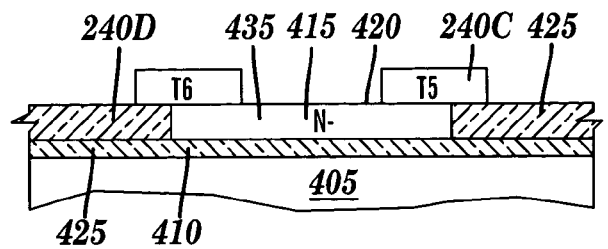
FIGS. 11A through 11E are partial cross sectional views illustrating fabrication of latch PFETs taken along line 11—11 of FIG. 6 in SOI technology.

In both FIGS. 10A and 11A, formed on top of a silicon substrate 405 is a buried insulator 410. Formed on top of buried insulator 410 is a thin silicon layer 415. In one example, buried insulator 410 is formed simultaneously with thin silicon layer 415 by an SIMOX method in which oxygen is implanted into a bulk silicon substrate. Substrate 405, buried insulator 410, and thin silicon layer 415 comprise an SOI substrate. Extending from a top surface 420 of thin silicon layer 415 through the thin silicon layer to buried insulator 410 is STI 425. In one example, STI 425 is fabricated by reactive ion etching a trench into thin silicon layer 415 down to buried insulator 410, filling the trench with chemical-vapor-deposition (CVD) insulator, such as silicon dioxide, and chemical-mechanical-polishing (CMP) the deposited insulator co-planar with top surface 420 of the thin silicon layer.

In FIG. 10A, thin silicon layer 415 has been doped P type to form P− region 430, while in FIG. 11A, thin silicon layer 415 has been doped N type to form—region 435. In one example, doping of thin silicon layer 415, either N or P type, is accomplished using an ion implantation process. In FIG. 10A, first gate conductor 240A and second gate conductor 240B are formed on top surface 420 of thin silicon layer 415. In FIG. 11A, third gate conductor 240C and fourth gate conductor 240D are formed on top surface 420 of thin silicon layer 415. In one example, first, second, third, and fourth gate conductors 240A, 240B, 240C and 240D are polysilicon, formed by a CVD process.

Figure 10B:
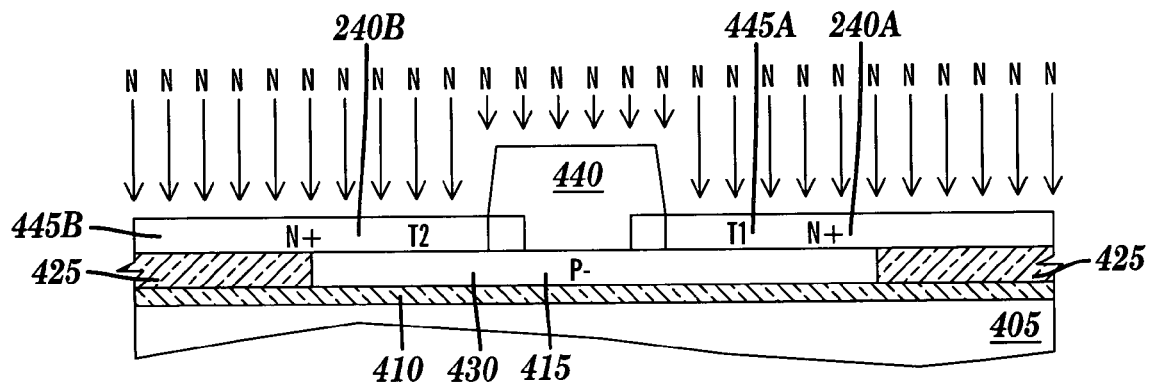
Figure 11B:
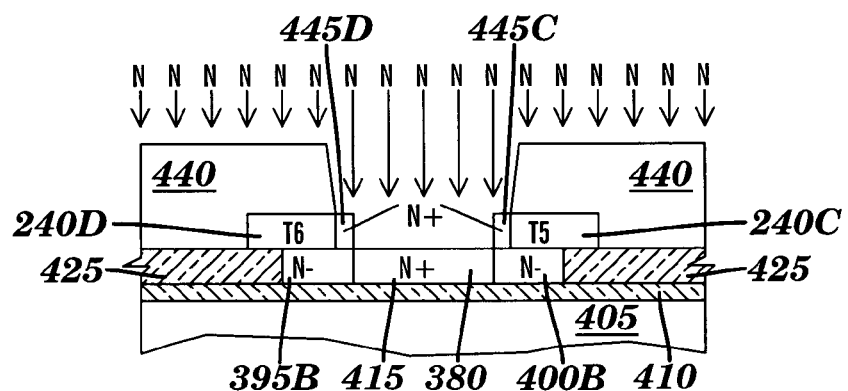

In FIGS. 10B and 11B, a first resist mask 440 is formed and an N type ion implantation performed. This N type implant may be the same implant as is used to form the source/drains all the NFETs in the SRAM cell. In FIG. 10B, the N type implantation results in formation of a first N+ doped region 445A in first gate conductor 240A and a second N+ doped region 445B in second gate conductor 240B. In FIG. 11B, the N type implantation results in formation of a third N+ doped region 445C in third gate conductor 240C and a fourth N+ doped region 445D in fourth gate conductor 240D. The N type implant also forms sixth connecting region 380. Also shown in FIG. 11B, is second portion 395B of seventh connecting region 395 and second portion 400B of fifth connecting region 400.

Figure 10C:
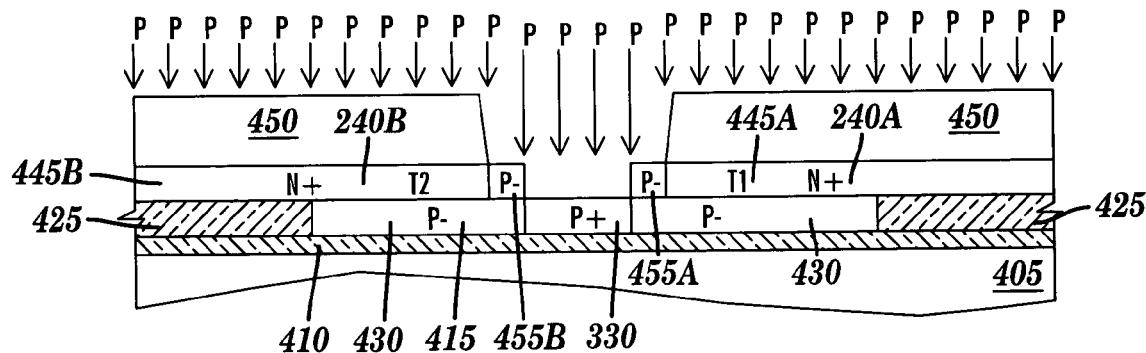
Figure 11C:
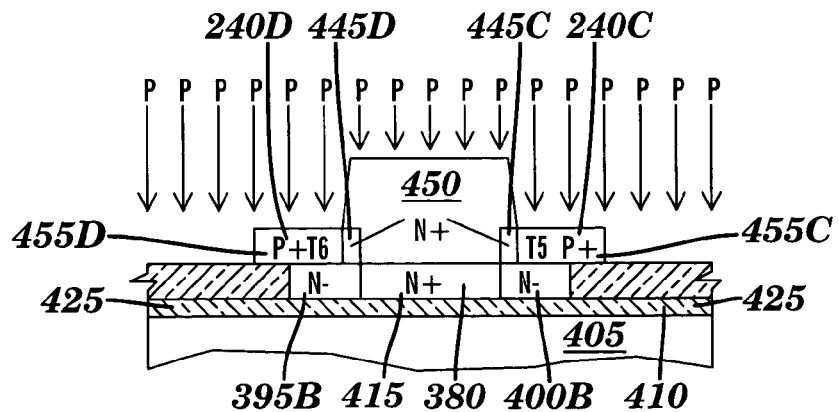

In FIGS. 10C and 11C, a second resist mask 450 is formed and a P type ion implantation performed. This P type implant may be the same implant as is used to form the source/drains all the PFETs in the SRAM cell. In FIG. 10C, the P type implantation results in formation of a first P+ doped region 455A in first gate conductor 240A and a second P+ doped region 445B in second gate conductor 240B. The P type implant also forms third connecting region 330. In FIG. 11B, the P type implantation results in formation of a third P+ doped region 455C in third gate conductor 240C and a fourth P+ doped region 455D in fourth gate conductor 240D.

Figure 10D:
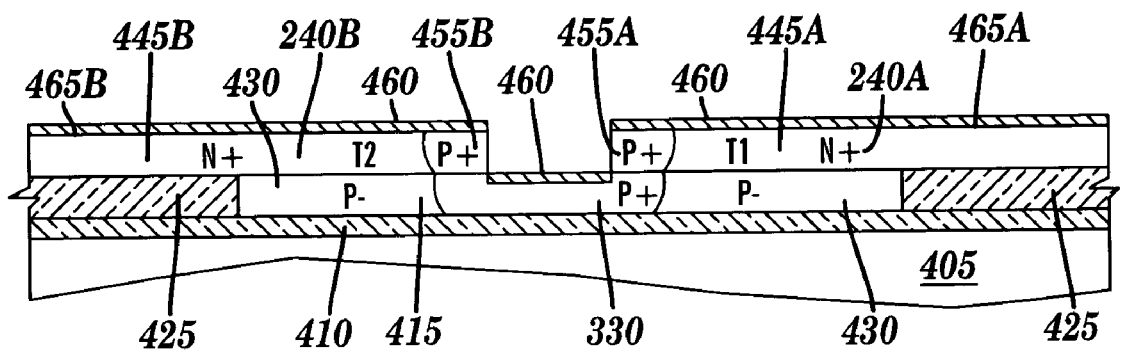

In FIG. 10D, a silicide layer 460 is formed on a top surface 465A of first gate conductor 240A, on a top surface 465B of second gate conductor 240B, and on top surface 420 of thin silicon layer 415 in third connecting region 330. Silicide later 460 spans first N+ doped region 445A and first P+ doped region 455A of first gate conductor 240A. Silicide layer 460 also spans second N+ doped region 445B and second P+ doped region 455B of second gate conductor 240B. Third connecting region 330 must be doped P+ in order to be able to form an ohmic contact to the third connecting region. Silicide layer 460 also provides conduction paths across the diodes formed at the interfaces of first N+ doped region 445A and first P+ doped region 455A of first gate conductor 240A and second N+ doped region 445B and second P+ doped region 455B of second gate conductor 240B.

Figure 11D:
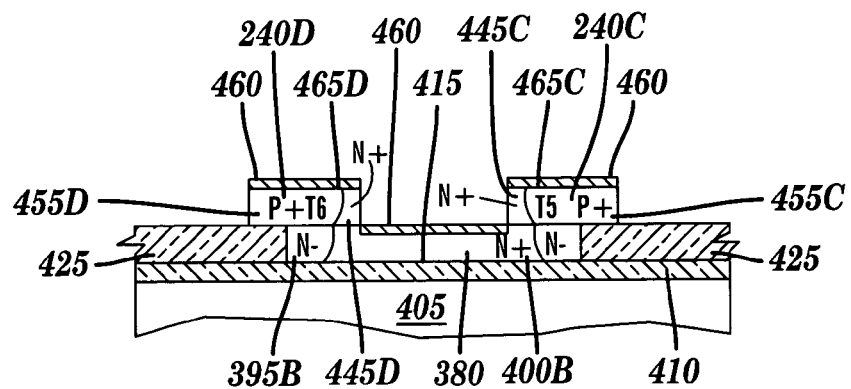

In FIG. 11D, a silicide layer 460 is formed on a top surface 465C of third gate conductor 240C, on a top surface 465D of fourth gate conductor 240D, and on top surface 420 of thin silicon layer 415 in sixth connecting region 380. Silicide later 460 spans third N+ doped region 445C and third P+ doped region 455C of third gate conductor 240C. Silicide layer 460 also spans fourth N+ doped region 445D and fourth P+ doped region 455D of fourth gate conductor 240D. Third connecting region 380 is doped N+ in order to be able to form an improved ohmic contact to the sixth connecting region. Silicide layer 460 also provides conduction paths across the diodes formed at the interfaces of third N+ doped region 445C and third P+ doped region 455C of third gate conductor 240C and fourth N+ doped region 445D and fourth P+ doped region 455D of fourth gate conductor 240D.

In one example silicide layer 460 is cobalt silicide or titanium silicide formed by depositing or evaporating cobalt or titanium on exposed silicon and polysilicon surfaces and then performing a sintering process, to react the metal with silicon, followed by an etch process to remove unreacted metal. Subsequently thermal anneals may be performed. N and P doped regions will diffuse during heat cycles. Consequently, third conducting region 330 in FIG. 10D and sixth conducting region 380 in FIG. 11D are shown in positions relative to the respective gate conductors after such heat cycles.

Figure 10E:
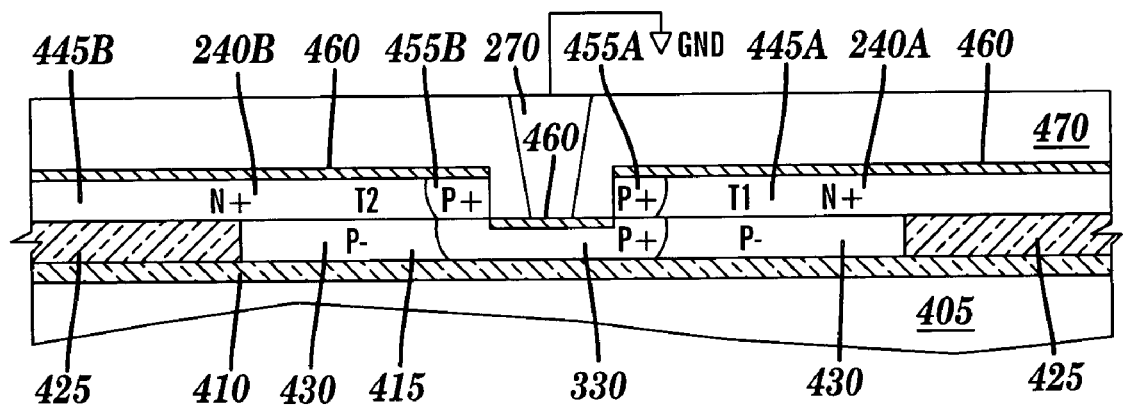
Figure 11E:
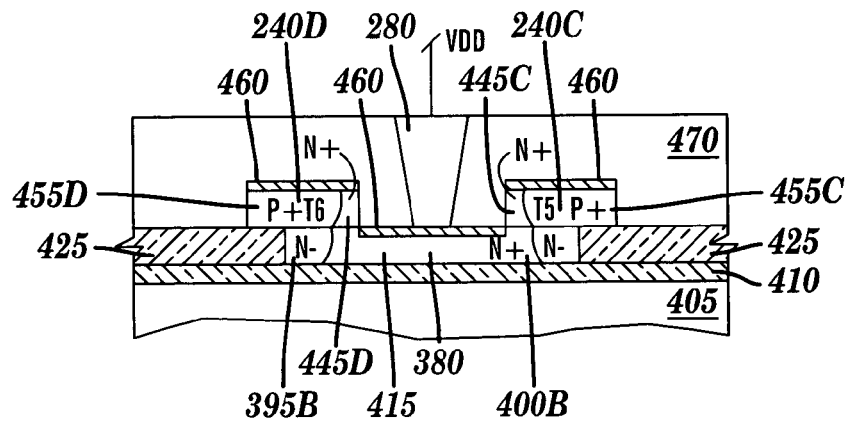

In FIGS. 10E and 11E, interlevel dielectric 470 is deposited. In one example, interlevel dielectric 470 is silicon oxide. In FIG. 10E, ground contact 270 is shown contacting silicide layer 460 on third channel region 330. Ground contact 270 is actually below the plane of the drawing sheet and is indicated for reference purposes. In FIG. 1E, $V_{DD}$ contact 280 is shown contacting silicide layer 460 on third channel region 330. $V_{DD}$ contact 280 is actually above the plane of the drawing sheet and is indicated for reference purposes.

Figure 12:
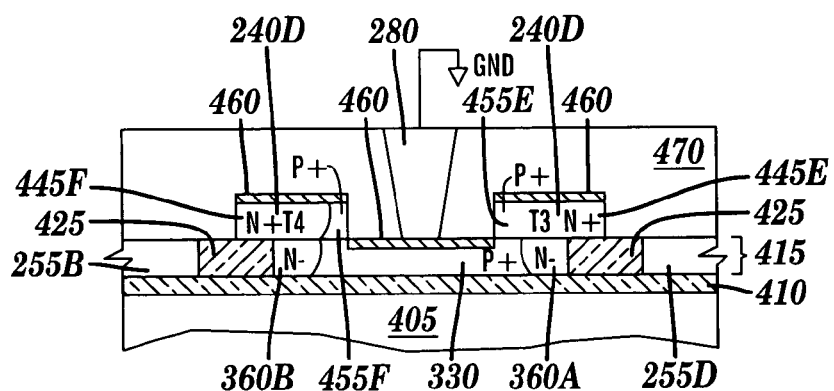
FIG. 12 is a partial cross sectional view of latch NFETs taken along line 12—12 of FIG. 6 fabricated in SOI technology.

FIG. 12 is a partial cross sectional view of latch NFETs taken along line 12—12 of FIG. 6 fabricated in SOI technology. In thin silicon layer 415 are first drain region 255B, second portion 360B of fourth connecting region 350, third channel region 330, second portion 365A of fifth connecting region 360, and second drain region 255D. Third gate conductor 240C is divided into a fifth N+ doped region 445E and fifth P+ doped region 455E. Fourth gate conductor 240D is divided into a sixth N+ doped region 445F and sixth P+ doped region 455F. Ground contact 270 is actually below the plane of the drawing sheet and is indicated for reference purposes.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. For example, SRAM cells 101, 102 and 103 may be mirrored in the vertical and/or horizontal direction to produce a cell combinations containing 2, 4, 8 and sixteen cells.

If SRAM cell 101 is mirrored vertically through bitline contact 265, GND contact 270 and bitline-not contact 275 a 2 cell combination is produced where the bodies of four latch NFETS are tied together through a shared ground contact. SRAM cell 101 may also be mirrored vertically through $V_{DD}$ contact 280. SRAM cell 101 may also be mirrored vertically through first wordline contact 285A or second wordline contact 285B. Multiple mirroring may be performed as well.

If SRAM cell 102 is mirrored vertically through bitline contact 265, GND contact 270 and bitline-not contact 275 a 2 cell combination is produced where the bodies of eight NFETs (four being latch NFETS) are tied together through a shared ground contact. SRAM cell 102 may also be mirrored vertically through $V_{DD}$ contact 280. SRAM cell 102 may also be mirrored vertically through first wordline contact 285A or second wordline contact 285B. Multiple mirroring may be performed as well.

If SRAM cell 103 is mirrored vertically through bitline contact 265, GND contact 270 and bitline-not contact 275 a 2 cell combination is produced where the bodies of eight NFETs (four latch NFETs) are tied together through a shared ground contact. IF SRAM cell 103 is mirrored vertically through $V_{DD}$ contact 280 a 2 cell combination is produced where the bodies of four latch PFETs are tied together through a shared $V_{DD}$ contact. SRAM cell 101 may also be mirrored vertically through first wordline contact 285A or second wordline contact 285B. Multiple mirroring may be performed as well.

Therefore it is intended that the following claims cover all such modifications and changes as fall within the true spirit and scope of the invention.

What is claimed is:

1. A semiconductor memory device comprising:
   an SOI substrate having a thin silicon layer on top of a buried insulator; and
   an SRAM comprising four NFETs and two PFETs located in said thin silicon layer, each said NFET and PFET having a body region between a source region and a drain region, and
   a first connecting region in said thin silicon layer abutting the source and body regions of each of two I/O NFETs of said four NFETs, said first connecting region and said body regions of said two I/O NFETs of said four NFETs electrically connected to ground, wherein a remaining two latch NFETs of said four NFETs are exclusive of said two I/O NFETs of said four NFETS, wherein the body region of each latch NFET of said remaining two NFETs is not electrically connected to ground, and wherein the body region of each PFET of said two PFETs is not electrically connected to ground.

* * * * *